United States Patent
Haba et al.

(10) Patent No.: US 8,641,913 B2
(45) Date of Patent: Feb. 4, 2014

(54) FINE PITCH MICROCONTACTS AND METHOD FOR FORMING THEREOF

(75) Inventors: Belgacem Haba, San Jose, CA (US); Yoichi Kubota, San Jose, CA (US); Teck-Gyu Kang, San Jose, CA (US); Jae M. Park, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 781 days.

(21) Appl. No.: 11/717,587

(22) Filed: Mar. 13, 2007

(65) Prior Publication Data

US 2008/0003402 A1  Jan. 3, 2008

Related U.S. Application Data

(63) Continuation-in-part of application No. 11/166,982, filed on Jun. 24, 2005, now Pat. No. 7,495,179, which is a continuation-in-part of application No. 10/959,465, filed on Oct. 6, 2004, now Pat. No. 7,462,936.

(60) Provisional application No. 60/583,109, filed on Jun. 25, 2004, provisional application No. 60/533,210, filed on Dec. 30, 2003, provisional application No. 60/533,393, filed on Dec. 30, 2003, provisional application No. 60/533,437, filed on Dec. 30, 2003, provisional application No. 60/508,970, filed on Oct. 6, 2003.

(51) Int. Cl.
*H01L 21/302* (2006.01)

(52) U.S. Cl.
USPC ............... 216/13; 216/17; 216/33; 216/41; 216/46; 216/49; 216/51; 216/83; 216/92; 216/95; 216/100; 216/105; 438/750; 29/830

(58) Field of Classification Search
None
See application file for complete search history.

(56) References Cited

U.S. PATENT DOCUMENTS

| | | | |
|---|---|---|---|
| 3,214,827 A | 11/1965 | Phohofsky | |
| 3,766,439 A | 10/1973 | Isaacson | |

(Continued)

FOREIGN PATENT DOCUMENTS

| | | |
|---|---|---|
| EP | 0615283 A1 | 9/1994 |
| EP | 1091406 A2 | 4/2001 |

(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner* — Anita Alanko
(74) *Attorney, Agent, or Firm* — Lerner, David, Littenberg, Krumholz & Mentlik, LLP

(57) ABSTRACT

A method includes applying a final etch-resistant material to an in-process substrate so that the final etch-resistant material at least partially covers first microcontact portions integral with the substrate and projecting upwardly from a surface of the substrate, and etching the surface of the substrate so as to leave second microcontact portions below the first microcontact portions and integral therewith, the final etch-resistant material at least partially protecting the first microcontact portions from etching during the further etching step. A microelectronic unit includes a substrate, and a plurality of microcontacts projecting in a vertical direction from the substrate, each microcontact including a base region adjacent the substrate and a tip region remote from the substrate, each microcontact having a horizontal dimension which is a first function of vertical location in the base region and which is a second function of vertical location in the tip region.

25 Claims, 10 Drawing Sheets

(56) References Cited

U.S. PATENT DOCUMENTS

| | | | |
|---|---|---|---|
| 3,775,844 A | 12/1973 | Parks | |
| 3,873,889 A | 3/1975 | Leyba | |
| 4,225,900 A | 9/1980 | Ciccio et al. | |
| 4,567,543 A | 1/1986 | Miniet | |
| 4,576,543 A | 3/1986 | Kuchyt et al. | |
| 4,695,870 A | 9/1987 | Patraw | |
| 4,716,049 A | 12/1987 | Patraw | |
| 4,781,601 A | 11/1988 | Kuhl et al. | |
| 4,804,132 A | 2/1989 | DiFrancesco | |
| 4,902,600 A | 2/1990 | Tamagawa et al. | |
| 4,924,353 A | 5/1990 | Patraw | |
| 4,941,033 A | 7/1990 | Kishida | |
| 4,975,079 A | 12/1990 | Beaman et al. | |
| 4,982,265 A | 1/1991 | Watanabe et al. | |
| 4,991,290 A | 2/1991 | MacKay | |
| 5,046,238 A | 9/1991 | Daigle et al. | |
| 5,083,697 A | 1/1992 | Difrancesco | |
| 5,116,459 A | 5/1992 | Kordus et al. | |
| 5,117,282 A | 5/1992 | Salatino | |
| 5,138,438 A | 8/1992 | Masayuki et al. | |
| 5,148,265 A | 9/1992 | Khandros et al. | |
| 5,148,266 A | 9/1992 | Khandros et al. | |
| 5,172,303 A | 12/1992 | Bernardoni et al. | |
| 5,189,505 A | 2/1993 | Bartelink | |
| 5,196,726 A | 3/1993 | Nishiguchi et al. | |
| 5,198,888 A | 3/1993 | Sugano et al. | |
| 5,214,308 A | 5/1993 | Nishiguchi et al. | |
| 5,220,448 A | 6/1993 | Vogel et al. | |
| 5,220,488 A | 6/1993 | Denes | |
| 5,222,014 A | 6/1993 | Lin | |
| 5,224,023 A | 6/1993 | Smith et al. | |
| 5,247,423 A | 9/1993 | Lin et al. | |
| 5,281,852 A | 1/1994 | Normington | |
| 5,313,416 A | 5/1994 | Kimura | |
| 5,324,892 A | 6/1994 | Granier et al. | |
| 5,334,875 A | 8/1994 | Sugano et al. | |
| 5,345,205 A | 9/1994 | Kornrumpf | |
| 5,347,159 A | 9/1994 | Khandros et al. | |
| 5,390,844 A | 2/1995 | Distefano et al. | |
| 5,394,303 A | 2/1995 | Yamaji | |
| 5,397,916 A | 3/1995 | Normington | |
| 5,397,997 A | 3/1995 | Tuckerman et al. | |
| 5,398,863 A | 3/1995 | Grube et al. | |
| 5,409,865 A | 4/1995 | Karnezos | |
| 5,422,435 A | 6/1995 | Takiar et al. | |
| 5,426,563 A | 6/1995 | Moresco et al. | |
| 5,440,171 A | 8/1995 | Miyano et al. | |
| 5,448,511 A | 9/1995 | Paurus et al. | |
| 5,454,160 A | 10/1995 | Nickel | |
| 5,455,390 A | 10/1995 | DiStefano et al. | |
| 5,455,740 A | 10/1995 | Burns | |
| 5,479,318 A | 12/1995 | Burns | |
| 5,489,749 A | 2/1996 | DiStefano | |
| 5,491,302 A | 2/1996 | Distefano et al. | |
| 5,518,964 A | 5/1996 | DiStefano et al. | |
| 5,536,909 A | 7/1996 | DiStefano et al. | |
| 5,552,963 A | 9/1996 | Burns | |
| 5,587,342 A | 12/1996 | Lin et al. | |
| 5,615,824 A | 4/1997 | Fjelstad et al. | |
| 5,646,446 A | 7/1997 | Nicewarner, Jr. et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,689,091 A | 11/1997 | Hamzehdoost et al. | |
| 5,717,556 A | 2/1998 | Yanagida | |
| 5,731,709 A | 3/1998 | Pastore et al. | |
| 5,739,585 A | 4/1998 | Akram et al. | |
| 5,762,845 A | 6/1998 | Crumly | |
| 5,776,797 A | 7/1998 | Nicewarner, Jr. et al. | |
| 5,777,386 A | 7/1998 | Higashi et al. | |
| 5,789,815 A | 8/1998 | Tessier et al. | |
| 5,798,286 A | 8/1998 | Faraci et al. | |
| 5,802,699 A | 9/1998 | Fjelstad et al. | |
| 5,805,422 A | 9/1998 | Otake et al. | |
| 5,811,982 A | 9/1998 | Beaman et al. | |
| 5,854,507 A | 12/1998 | Miremadi et al. | |
| 5,861,666 A | 1/1999 | Bellaar | |
| 5,956,234 A | 9/1999 | Mueller | |
| 5,973,391 A | 10/1999 | Bischoff et al. | |
| 5,980,270 A | 11/1999 | Fjelstad et al. | |
| 5,985,692 A | 11/1999 | Poenisch et al. | |
| 6,001,671 A | 12/1999 | Fjelstad | |
| 6,032,359 A | 3/2000 | Carroll | |
| 6,052,287 A | 4/2000 | Palmer et al. | |
| 6,054,756 A | 4/2000 | DiStefano et al. | |
| 6,059,984 A * | 5/2000 | Cohen et al. | 216/22 |
| 6,061,245 A | 5/2000 | Ingraham et al. | |
| 6,157,075 A | 12/2000 | Karavakis et al. | |
| 6,175,159 B1 | 1/2001 | Sasaki et al. | |
| 6,177,636 B1 | 1/2001 | Fjelstad | |
| 6,202,297 B1 | 3/2001 | Faraci et al. | |
| 6,216,941 B1 | 4/2001 | Yokoyama et al. | |
| 6,217,972 B1 | 4/2001 | Beroz et al. | |
| 6,229,220 B1 | 5/2001 | Saitoh et al. | |
| 6,235,996 B1 | 5/2001 | Farooq et al. | |
| 6,258,625 B1 | 7/2001 | Brofman et al. | |
| 6,300,679 B1 | 10/2001 | Mukerji et al. | |
| 6,307,260 B1 | 10/2001 | Smith et al. | |
| 6,322,903 B1 | 11/2001 | Siniaguine et al. | |
| 6,329,594 B1 | 12/2001 | Sturcken | |
| 6,332,270 B2 | 12/2001 | Beaman et al. | |
| 6,335,571 B1 | 1/2002 | Capote et al. | |
| 6,358,627 B2 | 3/2002 | Benenati et al. | |
| 6,362,525 B1 | 3/2002 | Rahim | |
| 6,458,411 B1 | 10/2002 | Goossen et al. | |
| 6,495,914 B1 | 12/2002 | Sekine et al. | |
| 6,514,847 B1 | 2/2003 | Ohsawa et al. | |
| 6,515,355 B1 | 2/2003 | Jiang et al. | |
| 6,522,018 B1 | 2/2003 | Tay et al. | |
| 6,545,228 B2 | 4/2003 | Hashimoto | |
| 6,550,666 B2 | 4/2003 | Chew et al. | |
| 6,555,918 B2 | 4/2003 | Masuda et al. | |
| 6,560,117 B2 | 5/2003 | Moon | |
| 6,578,754 B1 | 6/2003 | Tung | |
| 6,589,870 B1 | 7/2003 | Katoh et al. | |
| 6,624,653 B1 | 9/2003 | Cram | |
| 6,647,310 B1 | 11/2003 | Yi et al. | |
| 6,648,213 B1 | 11/2003 | Patterson et al. | |
| 6,681,982 B2 | 1/2004 | Tung | |
| 6,734,539 B2 | 5/2004 | Degani et al. | |
| 6,734,556 B2 | 5/2004 | Shibata | |
| 6,767,819 B2 | 7/2004 | Lutz | |
| 6,782,610 B1 | 8/2004 | Iijima et al. | |
| 6,815,252 B2 | 11/2004 | Pendse | |
| 6,852,564 B2 | 2/2005 | Ohuchi et al. | |
| 6,869,750 B2 | 3/2005 | Zhang et al. | |
| 6,870,274 B2 | 3/2005 | Huang et al. | |
| 6,875,638 B2 | 4/2005 | Yoneda et al. | |
| 6,888,255 B2 | 5/2005 | Murtuza et al. | |
| 6,902,869 B2 | 6/2005 | Appelt et al. | |
| 6,906,418 B2 | 6/2005 | Hiatt et al. | |
| 6,956,165 B1 | 10/2005 | Hata et al. | |
| 6,965,166 B2 | 11/2005 | Hikita et al. | |
| 6,995,044 B2 | 2/2006 | Yoneda et al. | |
| 6,995,469 B2 | 2/2006 | Hatakeyama | |
| 7,043,831 B1 * | 5/2006 | Farnworth et al. | 29/852 |
| 7,115,495 B2 * | 10/2006 | Wark et al. | 438/612 |
| 7,125,789 B2 | 10/2006 | Tellkamp et al. | |
| 7,183,190 B2 | 2/2007 | Saijo et al. | |
| 7,214,887 B2 | 5/2007 | Higashida et al. | |
| 7,361,285 B2 * | 4/2008 | Kim | 216/41 |
| 7,382,049 B2 | 6/2008 | Ho et al. | |
| 7,569,935 B1 | 8/2009 | Fan | |
| 7,598,613 B2 | 10/2009 | Tanida et al. | |
| 7,745,943 B2 | 6/2010 | Haba et al. | |
| 7,829,265 B2 | 11/2010 | Kitada et al. | |
| 8,115,310 B2 | 2/2012 | Masumoto et al. | |
| 2001/0008309 A1 | 7/2001 | Iijima et al. | |
| 2002/0056906 A1 | 5/2002 | Kajiwara et al. | |
| 2002/0074641 A1 | 6/2002 | Towle et al. | |
| 2002/0090756 A1 | 7/2002 | Tago et al. | |
| 2002/0125571 A1 | 9/2002 | Corisis et al. | |
| 2002/0153602 A1 | 10/2002 | Tay et al. | |
| 2002/0155661 A1 | 10/2002 | Massingill et al. | |

| | | | |
|---|---|---|---|
| 2002/0185735 | A1 | 12/2002 | Sakurai et al. |
| 2003/0001286 | A1 | 1/2003 | Kajiwara et al. |
| 2003/0019568 | A1 | 1/2003 | Liu et al. |
| 2003/0094700 | A1 | 5/2003 | Aiba et al. |
| 2003/0107118 | A1 | 6/2003 | Pflughaupt et al. |
| 2003/0127734 | A1 | 7/2003 | Lee et al. |
| 2003/0132518 | A1 | 7/2003 | Castro |
| 2003/0164540 | A1 | 9/2003 | Lee et al. |
| 2003/0189260 | A1 | 10/2003 | Tong et al. |
| 2003/0234453 | A1 | 12/2003 | Liu et al. |
| 2004/0031972 | A1 | 2/2004 | Pflughaupt et al. |
| 2004/0087057 | A1 | 5/2004 | Wang et al. |
| 2004/0201096 | A1* | 10/2004 | Iijima et al. ............. 257/734 |
| 2004/0245213 | A1* | 12/2004 | Fukase et al. ............. 216/14 |
| 2005/0097727 | A1 | 5/2005 | Iijima et al. |
| 2005/0101136 | A1 | 5/2005 | Mori |
| 2005/0116326 | A1 | 6/2005 | Haba et al. |
| 2005/0124091 | A1 | 6/2005 | Fukase et al. |
| 2005/0194695 | A1 | 9/2005 | Lin et al. |
| 2005/0285246 | A1 | 12/2005 | Haba et al. |
| 2006/0220259 | A1 | 10/2006 | Chen et al. |
| 2007/0017090 | A1 | 1/2007 | Sakai et al. |
| 2007/0045869 | A1 | 3/2007 | Ho et al. |
| 2007/0164447 | A1 | 7/2007 | Ho et al. |
| 2007/0230153 | A1 | 10/2007 | Tanida et al. |
| 2008/0003402 | A1 | 1/2008 | Haba et al. |
| 2009/0002964 | A1 | 1/2009 | Haba |
| 2009/0115047 | A1 | 5/2009 | Haba et al. |
| 2009/0146303 | A1 | 6/2009 | Kwon |
| 2009/0188706 | A1 | 7/2009 | Endo |
| 2010/0044860 | A1 | 2/2010 | Haba et al. |

FOREIGN PATENT DOCUMENTS

| | | |
|---|---|---|
| EP | 1602749 | 12/2005 |
| JP | 62117346 A | 5/1987 |
| JP | 62-68015 A | 9/1994 |
| JP | 7211722 A | 8/1995 |
| JP | 11097576 A | 4/1999 |
| JP | 2000277649 A | 10/2000 |
| JP | 2001244365 A | 9/2001 |
| JP | 2002124548 A | 4/2002 |
| JP | 2002-313996 A | 10/2002 |
| JP | 2003007768 A | 1/2003 |
| JP | 2004221450 A | 8/2004 |
| JP | 2005026645 A | 1/2005 |
| JP | 2005032964 A | 2/2005 |
| JP | 2005216696 A | 8/2005 |
| JP | 2007023338 A | 2/2007 |
| WO | 0141207 A1 | 6/2001 |
| WO | 2006004672 A1 | 1/2006 |
| WO | 2006057097 A1 | 6/2006 |
| WO | 2009023283 A2 | 2/2009 |

OTHER PUBLICATIONS

Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
International Search Report, PCT/US2008/03473, Dated Sep. 15, 2008.
Office Action from Japanese Application No. 2007-518347 dated Feb. 1, 2011.
Choubey A; Hao Yu; Osterman M; Pecht M; Fu Yun; Li Yonghong; Xu Ming: "Intermetallics Characterization of lead-free solder joints under isothermal aging" Journal of Electronic Materials, vol. 37, No. 8, May 28, 2008, pp. 1130-1138, XP002555807.
Extended European Search Report for Application No. EP 08835829.6 dated Feb. 28, 2012.
International Search Report and Written Opinion, PCT/US2009/004694, mailed Dec. 7, 2009.
International Search Report, PCT/US2008/011271, dated Mar. 27, 2009.
Korean Office Action for Application No. 10-2011-7006476 dated May 30, 2012.
Supplementary Partial European Search Report for Application No. EP 08835829 dated Feb. 21, 2012.
Japanese Office Action for Application No. 2007-518347 dated Nov. 2, 2012.

* cited by examiner

FINE PITCH MICROCONTACTS AND METHOD FOR FORMING THEREOF

CROSS-REFERENCE TO RELATED APPLICATIONS

This application is a continuation-in-part of U.S. patent application Ser. No. 11/166,982, filed Jun. 24, 2005, now U.S. Pat. No. 7,495,179 which claims the benefit of the filing date of U.S. Provisional Patent Application No. 60/583,109, filed Jun. 25, 2004. application Ser. No. 11/166,982 is also a continuation-in-part of U.S. patent application Ser. No. 10/959,465, filed Oct. 6, 2004, now U.S. Pat. No. 7,462,936. application Ser. No. 10/959,465 also claims the benefit of the filing dates of U.S. Provisional Patent Application No. 60/508,970, filed Oct. 6, 2003; 60/533,210, filed Dec. 30, 2003; 60/533,393, filed Dec. 30, 2003; and 60/533,437, filed Dec. 30, 2003. The disclosures of all of the aforementioned applications are hereby incorporated by reference herein.

BACKGROUND OF THE INVENTION

The present invention relates to microelectronic packages, to components for use in fabrication of microelectronic packages, and to methods of making the packages and component.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

For these and other reasons, further improvement would be desirable.

SUMMARY OF THE INVENTION

In one embodiment, a method of forming microcontacts, includes, (a) providing a first etch-resistant material at selected locations on a top surface of a substrate, (b) etching a top surface of the substrate at locations not covered by the first etch-resistant material and thereby form first microcontact portions projecting upwardly from the substrate at the selected locations, (c) providing a second etch-resistant material on the first microcontact portions, and (d) further etching the substrate to form second microcontact portions below the first microcontact portions, the second etch-resistant material at least partially protecting the first microcontact portions from etching during the further etching step.

In another embodiment, a method of forming microcontacts, includes (a) applying a final etch-resistant material to an in-process substrate so that the final etch-resistant material at least partially covers first microcontact portions integral with the substrate and projecting upwardly from a surface of the substrate, and (b) etching the surface of the substrate so as to leave second microcontact portions below the first microcontact portions and integral therewith, the final etch-resistant material at least partially protecting the first microcontact portions from etching during the further etching step.

In still another embodiment, a microelectronic unit includes (a) a substrate, and (b) a plurality of microcontacts projecting in a vertical direction from the substrate, each microcontact including a base region adjacent the substrate and a tip region, remote from the substrate, each microcontact having a horizontal dimension which is a first function of vertical location in the base region and which is a second function of vertical location in the tip region.

In yet another embodiment, a microelectronic unit includes a substrate, a plurality of microcontacts projecting in a vertical direction from the substrate wherein a pitch between two adjacent microcontacts is less than 150 microns.

In still another embodiment, a microelectronic unit includes (a) a substrate, and (b) a plurality of elongated microcontacts projecting in a vertical direction from the substrate, each microcontact including a base region adjacent the substrate and a tip region, remote from the substrate, each microcontact having an axis and a circumferential surface which slopes toward or away from the axis in the vertical direction along the axis, such that the slope of the circumferential wall changes abruptly at a boundary between the tip region and the base region.

In another embodiment, a microelectronic unit includes (a) a substrate, and (b) a plurality of microcontacts projecting in a vertical direction from the substrate, each microcontact having a proximal portion adjacent the substrate and an elongated distal portion extending from the proximal portion in the vertical direction away from the substrate, the width of the post increasing in stepwise fashion at the juncture between the proximal and distal portions.

DETAILED DESCRIPTION

Figure 1:
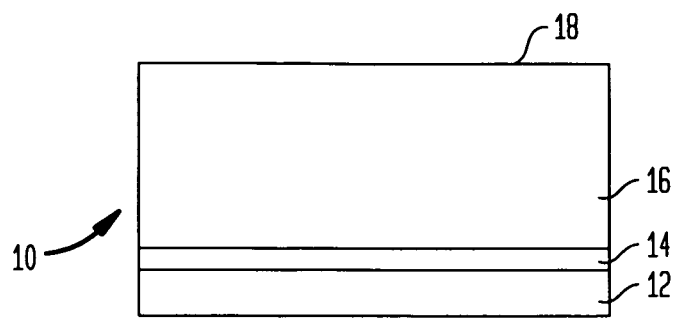
FIG. 1 is a schematic illustration of a substrate.

A first method or embodiment is described. FIG. 1 is a schematic illustration of a tri-metal substrate 10. The tri-metal substrate 10 has a trace layer 12, an etch stop layer 14, a thick layer 16, and a top surface 18. The trace layer 12 and the thick layer 16 may be formed of a readily etchable first metal such as copper, while the etch stop layer 14 may be formed of a metal, such as nickel, which is substantially resistant to etching by a process used to etch copper. Although, copper and nickel are recited, the substrate 10 may be formed of any suitable material as desired.

Figure 2:
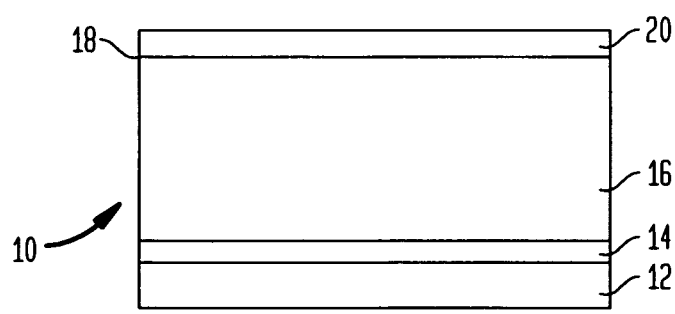
FIG. 2 is a schematic illustration of the substrate of FIG. 1 with a layer of photoresist.

FIG. 2 is a schematic illustration of the tri-metal substrate 10 of FIG. 1 with a layer of a first photoresist 20. The first photoresist 20 is deposited onto the top surface 18. The first photoresist 20 may be any type of material that hardens or undergoes a chemical reaction when exposed to radiation such as light. Thus, any etch-resistant material maybe used. Positive and negative photoresists may also be utilized and are known in the art. As used herein, the terms "top," "bottom" and other directional terms are to be taken as relative to the microelectronic element, rather than directions based on gravity.

Figure 3:
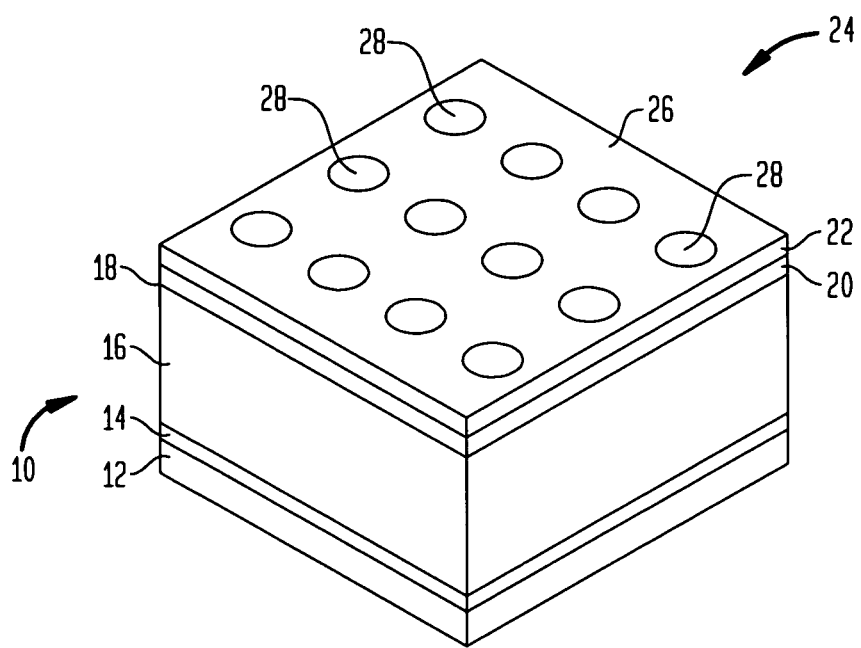
FIG. 3 is a perspective schematic illustration of the substrate of FIG. 1 with a layer of photoresist and a mask.

FIG. 3 is a perspective schematic illustration of the tri-metal substrate of FIG. 1 with the layer of first photoresist 20 and a mask 22. The mask 22 is often a transparent plate with opaque areas printed on it called a photomask or shadow-mask, creating a pattern 24 on the mask 22 with areas covered by the mask 22, denoted by reference numeral 26, and areas not covered by the mask 22, denoted by reference numeral 28. The pattern 24 with the covered and uncovered areas, 26 and 28, respectively, allows for selectively exposing parts of the first photoresist 20 to radiation.

Once the mask 22 is placed atop the first photoresist 20, radiation is provided. Most often the radiation is in the form of ultraviolet light. This radiation exposes the first photoresist 20 at the uncovered areas 28 resulting in making the uncovered areas 28 insoluble. The opposite is true when a negative photoresist is used: the covered areas 26 become insoluble. After exposing the first photoresist 20, the mask 22 is removed. The first photoresist 20 is then developed by washing with a solution which removes the first photoresist 20 in the locations where the first photoresist 20 has not become insoluble. Thus, the photoresist exposure and development leaves a pattern of insoluble material on the top of surface 18 of the substrate 10. This pattern of insoluble material mirrors the pattern 24 of the mask 22.

Figure 4:
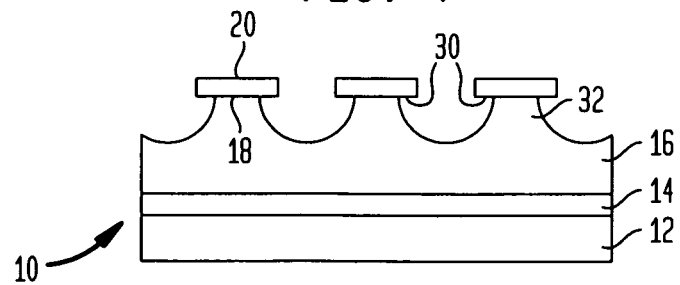
FIG. 4 is a schematic illustration of the substrate of FIG. 1 being etched.

After exposure and development of the photoresist, the substrate is etched as shown in FIG. 4. Once a certain depth of etching is reached, the etching process is interrupted. For example, the etching process can be terminated after a predetermined time. The etching process leaves first microcontact portions 32 projecting upwardly from substrate 10 at the thick layer 16. As the etchant attacks the thick layer 16, it removes material beneath the edges of first photoresist 20 allowing the first photoresist 20 to project laterally from the top of first microcontact portions 32, denoted as overhang 30. The first photoresist 20 remains at particular locations as determined by the mask 22.

Figure 5:
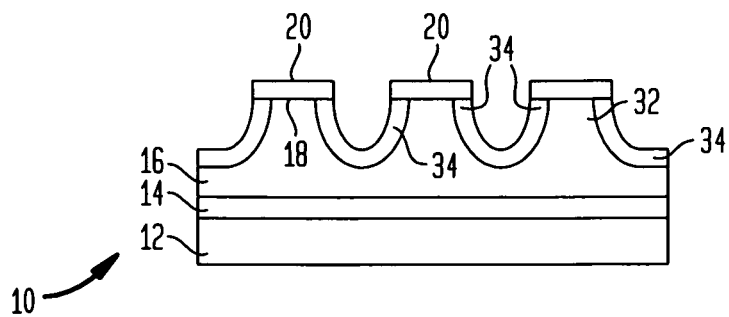
FIG. 5 is a schematic illustration of the substrate of FIG. 1 with a second photoresist.

Once the thick layer 16 has been etched to a desired depth, a second layer of photoresist 34 (FIG. 5) is deposited on the tri-metal substrate 10. In this instance, the second photoresist 34 is deposited onto the thick layer 16 at the locations where the thick layer 16 has been previously etched. Thus, the second photoresist 34 also covers the first microcontact portions 32. If using electrophoretic photoresists, the second photoresist 34, due to its inherent chemical properties, does not deposit onto the first photoresist 20.

Figure 6:
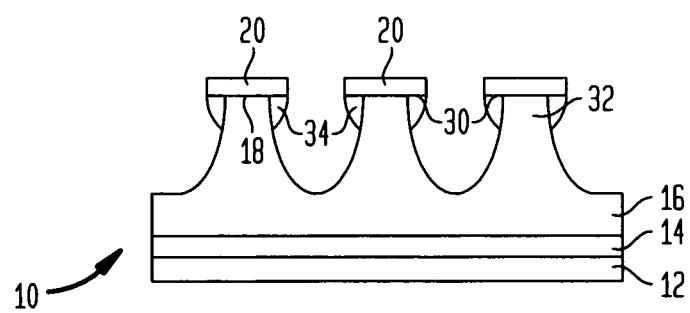
FIG. 6 is a schematic illustration of the substrate of FIG. 1 having the second photoresist developed.

At the next step, the substrate with the first and second photoresists, 20 and 34 is exposed to radiation and then the second photoresist is developed. As shown in FIG. 6, the first photoresist 20 projects laterally over portions of the thick layer 16, denoted by overhang 30. This overhang 30 prevents the second photoresist 34 from being exposed to radiation and thus prevents it from being developed and removed, causing portions of the second photoresist 34 to adhere to the first microcontact portions 32. Thus, the first photoresist 20 acts as a mask to the second photoresist 34. The second photoresist 34 is developed by washing so as to remove the radiation exposed second photoresist 34. This leaves the unexposed portions of second photoresist 34 on the first microcontact portions 32.

Figure 7:
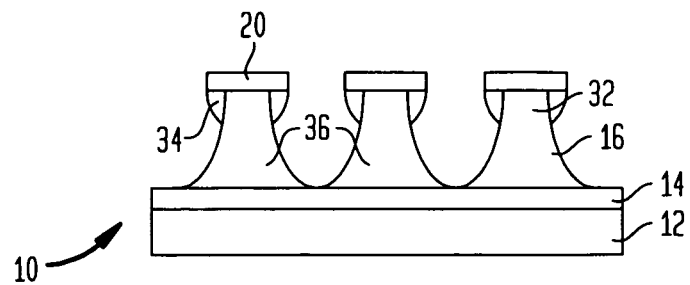
FIG. 7 is a schematic illustration of the substrate of FIG. 1 being etched a second time.

Once portions of the second photoresist 34 have been exposed and developed, a second etching process is performed, removing additional portions of the thick layer 16 of the tri-metal substrate 10, thereby forming second microcontact portions 36 below the first microcontact portions 32 as shown in FIG. 7. During this step, the second photoresist 34, still adhered to first microcontact portions 32, protects the first microcontact portions 32 from being etched again.

These steps may be repeated as many times as desired to create the preferred aspect ratio and pitch forming third, fourth or nth microcontact portions. The process may be stopped when the etch-stop layer 14 is reached. As a final step, the first and second photoresists 20 and 34, respectively, may be stripped entirely.

Figure 8A:
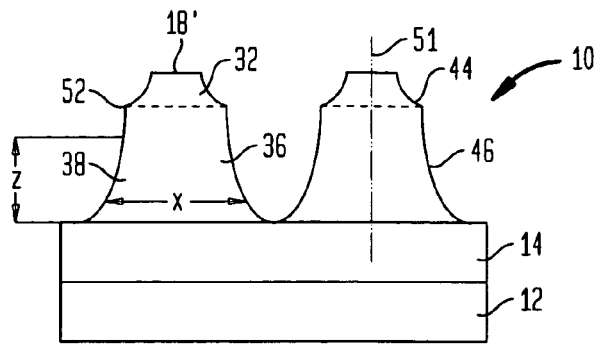
FIGS. 8A-8D are example profiles of microcontacts.
Figure 8B:
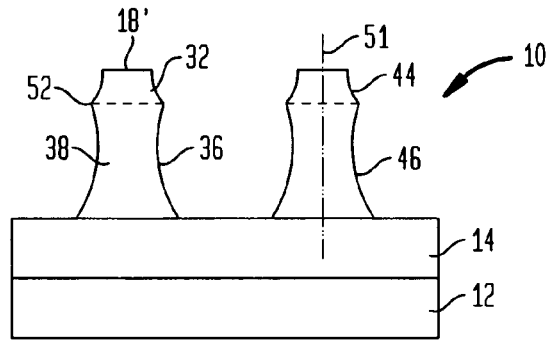
Figure 8C:
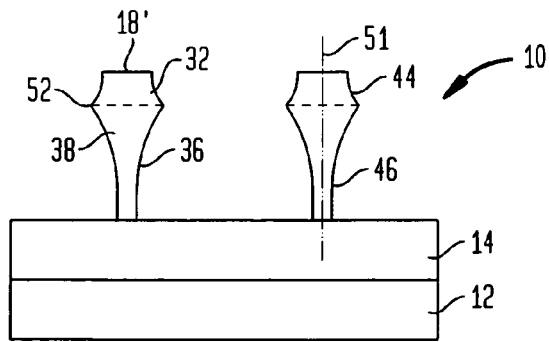

These processes result in microcontacts 38 shown in FIGS. 8A through 8D. These figures also illustrate the various profiles that may be achieved using the processes described herein. Referring to FIGS. 8A-8C, the microcontacts 38 have a first portion 32, also known as a tip region, and a second portion 36, also referred to as the base region. Provided that the spots of first photoresist used in the steps discussed above are circular, each microcontact will be generally in the form of a body of revolution about a central axis 51 (FIG. 8A) extending in a vertical or Z direction, upwardly from the remainder of the substrate and generally perpendicular to the plane of the etch stop layer 14. The widths or diameters X of the first and second portions vary with position in the Z or height direction within each portion. Stated another way, within the first portion, $X=F_1(Z)$, and within the second portion $X=F_2(Z)$. The slope or $$\frac{dX}{dZ}$$

may change abruptly at the boundary 52 between the first and second portions. The particular functions and hence the shape of the microcontacts are determined by the etching conditions used in the first and second etching steps. For example, the composition of the etchant and etching temperature can be varied to vary the rate at which the etchant attacks the metal layer. Also, the mechanics of contacting the etchant with the metal layer can be varied. The etchant can be sprayed forcibly toward the substrate, or the substrate can be dipped into the etchant. The etching conditions may be the same or different during etching of the first and second portions.

In the microcontacts shown in FIG. 8A, the first portion 32 has a circumferential surface 44 which flares outwardly in the downward direction, so that the magnitude of the slope or $$\frac{dX}{dZ}$$

increases in the downward direction. The second portion 36 also has a circumferential surface 46 flares outwardly; the magnitude of the slope or $$\frac{dX}{dZ}$$

of the second is at a minimum at boundary 52, and progressively increases in the direction toward the base of the post. There is a substantially change in slope at boundary 52. The maximum width or diameter X of the second portion, at the base of the microcontact where the microcontact joins layer 14, is substantial greater than the maximum width or diameter of the first portion. In FIG. 8B, the maximum width of second portion 36 is only slightly greater than the maximum width of first portion 32. Also, the second portion has a minimum width at a location between the base of the post and the boundary 52, so that the width gradually decreases in the upward direction to the minimum and then progressively increases in the upward direction from the minimum to the boundary 52. Such a shape is commonly referred to as a "cooling tower" shape. In the microcontacts of FIG. 8B, the slope or $$\frac{dX}{dZ}$$

changes sign at the boundary 52 between the portions. In FIG. 8C, the second portion 36 has its minimum width near the base of the microcontact.

Figure 8D:
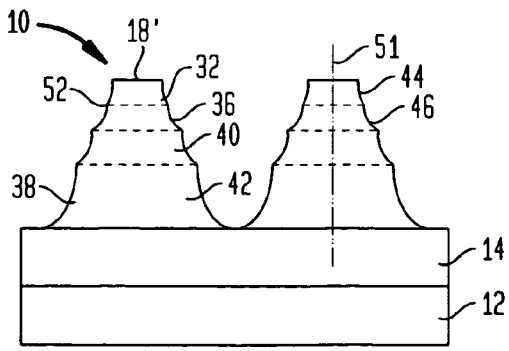

Lastly, FIG. 8D illustrates a profile of a microcontact 38 having more than two portions. This type of profile may result in the event the steps of the processes described herein are performed numerous times. Thus, it can be seen that this particular microcontact 38 has four portions, the first and second portions 32 and 36, respectively, and third and fourth portions, 40 and 42, respectively. These four portions may have any dimension and be wider or slimmer than another portion as desired. In this instance, there may be greater than one boundary. FIGS. 8A-8D are only representative profiles and a variety of profiles may be achieved.

Although arrays including only two microcontacts or posts are depicted in each of FIGS. 8A-8D, in practice, an array of posts including numerous posts can be formed. In the embodiments depicted in each of FIGS. 8A-8D, all of the microcontacts or posts in the array are formed from a single metallic layer 16 (FIG. 1). Each microcontact overlies a portion of the etch stop layer 14 at the base of the microcontact, where the microcontact connects to metallic layer 12. As discussed below, the etch stop layer 14 typically is removed in regions between the microcontact, and metallic layer 12 typically is etched or otherwise treated to convert it into traces or other conductive features connected to the microcontact. However, the body of each microcontact, from its base to its tip, is a unitary body, free of joints such as welds, and having substantially uniform composition throughout. Also, because the tip surfaces 18' of the microcontacts, at the ends of the microcontacts remote from layers 12 and 14, are portions of the original top surface 18 of metal layer 16 (FIG. 1), these tip surfaces are substantially flat and horizontal, and the tip surfaces of all of the microcontacts are substantially coplanar with one another.

In an alternate embodiment, rather than remove the first photoresist 20 only at selected locations after the first etching step, the entire first photoresist 20 may be removed. In this instance, the second photoresist 34 may be deposited over the entire surface of the substrate 10. Then the mask 22 is placed onto the second photoresist 34. The mask 22 must be properly aligned so as to expose only at the locations previously exposed, on the first microcontact portions 32. The second photoresist 34 is then developed and further etching may be performed on the substrate 10.

Figure 9:
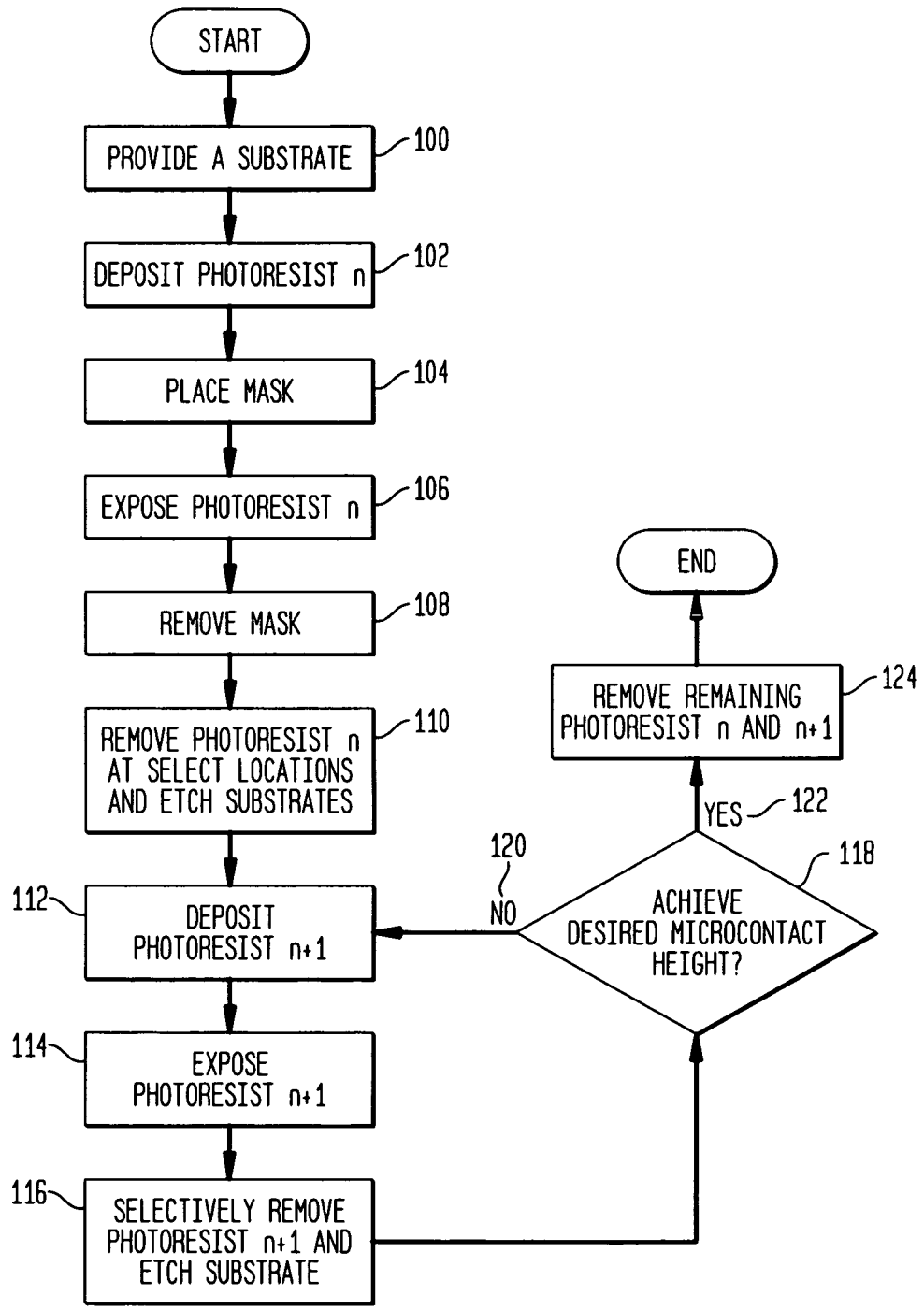
FIG. 9 is a flowchart depicting a first embodiment.

FIG. 9 is a flowchart depicting the first embodiment. Beginning at step 100, a substrate is provided. Then at step 102, a photoresist n is deposited onto the substrate. Then at step 104, a mask is placed atop the photoresist n. At step 106 the photoresist n is exposed to radiation. Subsequently, at step 108 the mask is removed and then at step 110, the photoresist n is developed at select locations and the substrate is etched.

Next, another photoresist is deposited, known as n+1 at step 112. Then, at step 114, this n+1 photoresist is exposed to radiation. Subsequently, at step 116, the photoresist n+1 is removed at select locations and the substrate is etched again. Then, it is evaluated whether the desired microcontact height has been achieved at step 118. If the desired microcontact height has not been achieved, at step 120, the process returns to step 112 and another photoresist is deposited onto the substrate. If the desired height has been achieved at step 122, then the remaining photoresists are removed at step 124 and the process ends.

Figure 10:
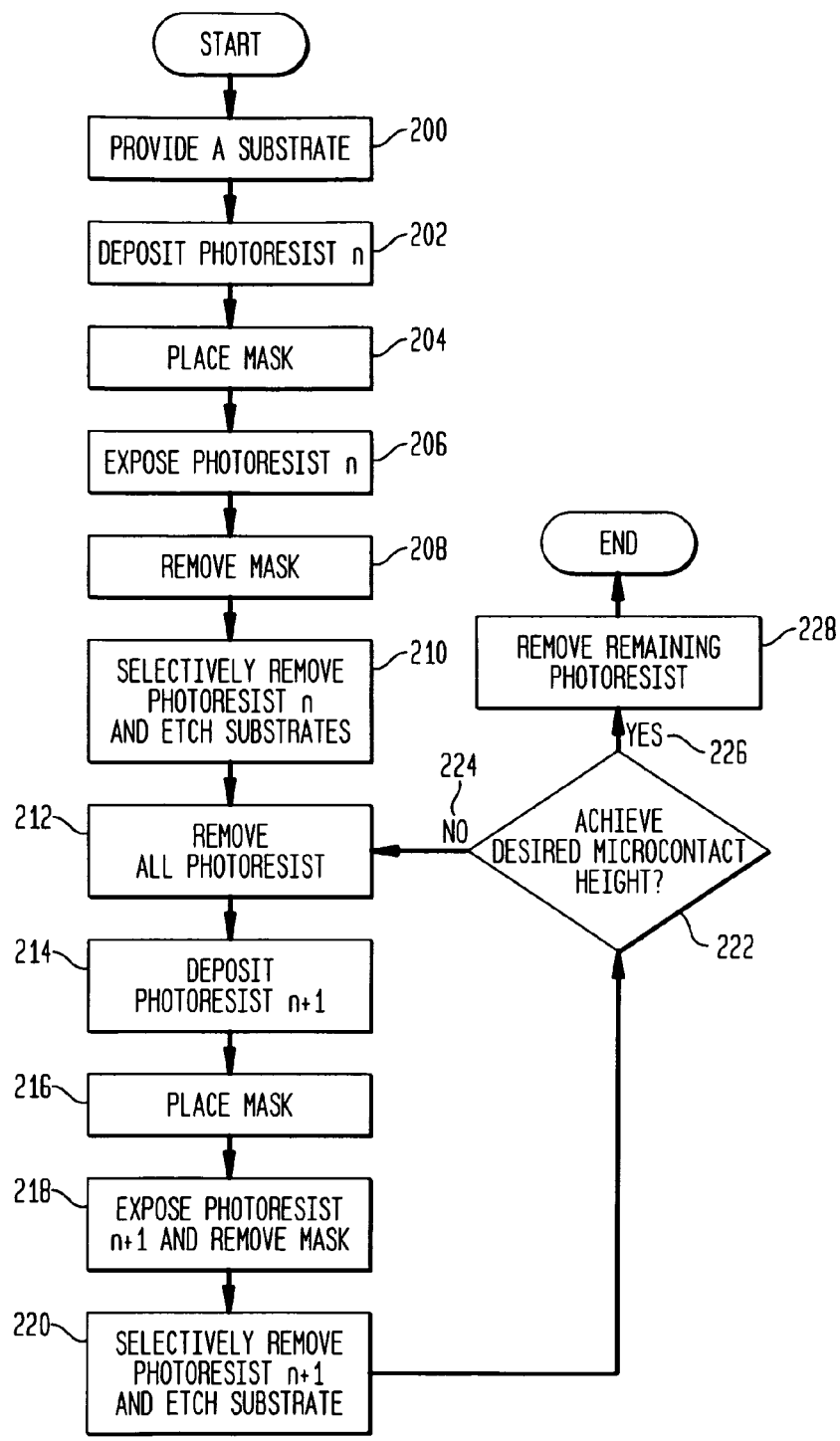
FIG. 10 is a flowchart depicting a second embodiment.

FIG. 10 is a flowchart depicting a second embodiment. Steps 200-210 of the second embodiment mirror steps 100-110 of the first embodiment. However, at step 212, the entire photoresist n is removed. Then, at step 214, another layer of photoresist n+1 is deposited onto the substrate. Next, the mask is placed back onto the substrate at step 216. During this step, the mask must be aligned such that its pattern is situated in substantially the same location as when the mask was placed on the photoresist n. Subsequently, at step 218, the photoresist n+1 is exposed to radiation and the mask is removed.

Next, at step 220, photoresist n+1 is selectively removed and the substrate is etched again. This process may also be repeated until the desired microcontact height is achieved. Thus, at step 222, it is evaluated whether the desired microcontact height has been achieved. If the preferred height has not been achieved at step 224, then the process returns to step 212 where the photoresist is removed entirely and another photoresist n+1 is deposited and the steps continue thereon. However, if the desired height has been achieved at step 224, the remaining photoresist is removed at step 228 and the process ends.

The etch-stop layer 14 and the thin layer 12 may be united with a dielectric layer and then thin layer 12 may be etched to form traces so as to provide a component with the microcontacts connected to the traces and with the microcontacts projecting from the dielectric layer. Such a structure can be used, for example, as an element of a semiconductor chip package. For example, U.S. patent application Ser. No. 11/318,822, filed Dec. 27, 2005, now U.S. Pat. No. 7,632,708 the disclosure of which is hereby incorporated by reference herein, may be used.

Figure 11:
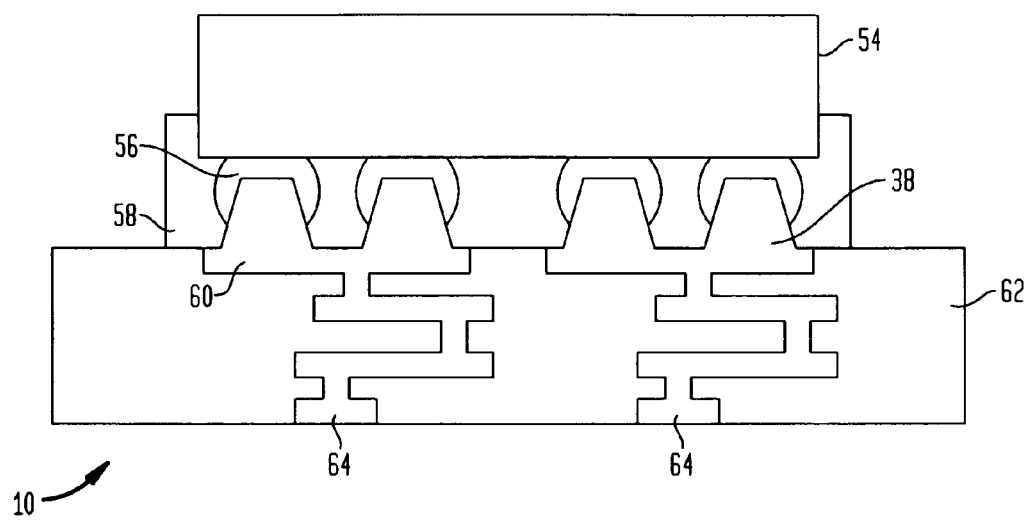
FIG. 11 is a schematic illustration of a multi-layer substrate in application.

The structure described herein may be an integral part of a multilayer substrate 10, for instance, the top layer of a multilayer substrate 10, as shown in FIG. 11. Microcontacts 38 may be soldered to the die 54. The solder 56 may wick around a portion of the microcontacts 38. Wicking provides very good contact between the microcontacts 38 and the die 54. Other bonding processes besides solder 56 may also be used. Surrounding the microcontacts 38 is underfill 58, used to adhere the die 54 to the microcontacts 38 and the substrate 10. Any type of underfill 58 may be used as desired or underfill 58 may be omitted. Below the microcontacts 38 are traces 60 and a dielectric layer 62. Terminals 64 are disposed at the bottom of the substrate 10.

Certain packages include microelectronic chips that are stacked. This allows the package to occupy a surface area on a substrate that is less than the total surface area of the chips in the stack. Packages which include microcontacts fabricated using the processes recited herein may be stacked. Reference is made to co-pending U.S. patent application Ser. No. 11/140,312, filed May 27, 2005; now U.S. Pat. No. 7,453, 157 and U.S. Pat. No. 6,782,610, the disclosures of which are hereby incorporated by reference. The microcontact etching steps taught in these disclosures may be replaced by the processes discussed herein.

Although a tri-metal substrate is discussed above, a suitable substrate having any number of layers may be utilized, such as for example a single metal. Additionally, rather than use a photoresist, an etch-resistant metal such as gold or other metal substantially resistant to the etchant used to etch the thick metallic layer, may be used. For example, the etch-resistant metal can be used in place of the first photoresist 20 discussed above. Spots of etch-resistant metal may be plated onto the top of the thick layer 16 after applying a mask such as a photoresist with holes at the desired locations for the spots. After plating the etch-resistant metal onto the top of the thick layer, the thick layer is etched to form the microcontacts as discussed above. The etch-resistant metal may be left in place on the tip of the microcontact. In the event an etch-resistant metal is used, as a second etch-resistant material (in place of second photoresist 34 discussed above), a mask may be used to limit deposition of the second etch-resistant metal to only the first portions 32 of the microcontacts, so that the areas between the microcontacts remain free of the etch-resistant metal. Alternately, the entire first layer of etch-resistant metal may be removed upon etching first microcontact portions 32, then a second layer of etch-resistant metal may be deposited to protect the first microcontact portions 32.

Figure 12:
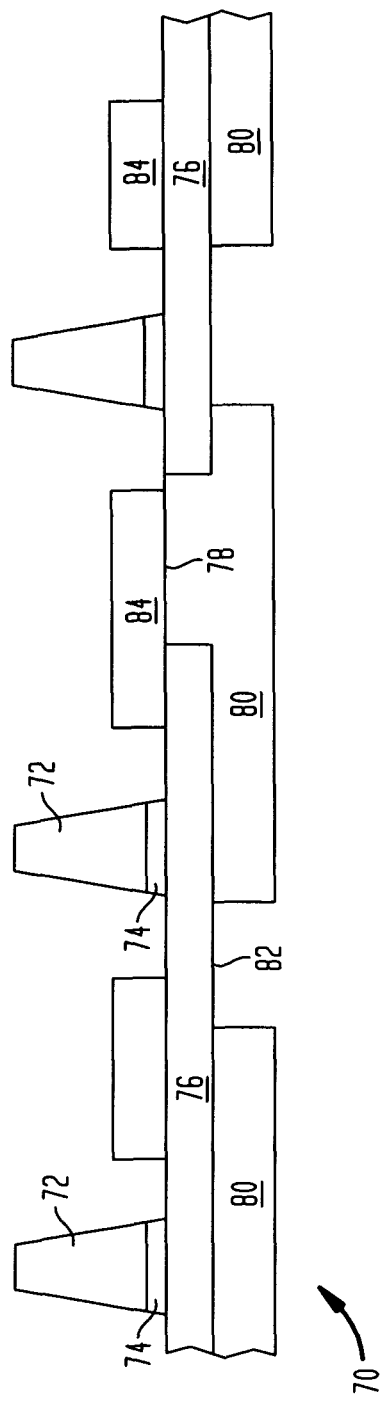
FIG. 12 is a schematic illustration of microelectronic unit.

With reference to FIG. 12, a microelectronic unit 70 is shown having microcontacts 72. The microcontacts 72 have an etch stop layer 74. The microcontacts 72 project vertically from a metallic layer that has been formed into traces 76. There may be gaps or spaces 78 between the traces 76. A first layer of dielectric 80 may be adhered to a bottom side of the unit 70 adjacent the traces 76. Openings 82 in the first layer of dielectric 80 allow the traces 76 to form electronic contacts. A second layer of a dielectric 84 may be formed on a top side of the unit 70.

Figure 13:
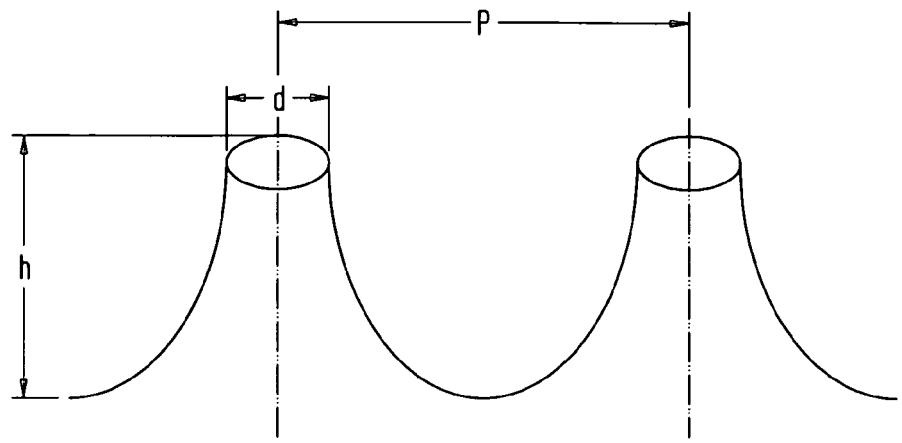
FIG. 13 is a schematic illustration of two adjacent microelectronic units.

The microcontacts formed from these processes may have a typical height ranging from about 40 microns to about 200 microns. Further, the typical pitch between microcontacts may be less than about 200 microns, preferably less than 150 microns. In particular, in reference to FIG. 13, two microcontacts are shown having a tip diameter d and a microcontact height h. A pitch P is defined by the distance between the longitudinal axes of the two microcontacts.

In many applications, particularly where microcontacts are used connected to contacts of a semiconductor chip as, for example, in a structure as discussed below with reference to FIG. 14, it is desirable to provide a small pitch. However, in a process where the microcontacts are formed from a single metal layer by a single etching process, it is normally not practical to make the pitch P less than a certain minimum pitch $P_0$ which is equal to the sum of the diameter d plus the height h. Thus, $P_0=d+h$. In theory, the minimum pitch could be reduced by reducing the tip diameter d. However, it is impossible to make the tip diameter less than zero. Moreover, in many cases it is undesirable to reduce the tip diameter below about 20 or 30 microns. For example, the adhesion between the tips of the pins and spots of photoresist used to protect the tips during etching is proportional to the area of the tips, and hence to the square of the tip diameter. Therefore, with very small tip diameters, the photoresist spots can be dislodged during processing. Thus, using conventional processes, it has been difficult to form microcontacts with very small pitch.

However, the pitch between microcontacts using the process recited herein can be less than $P_o$, ($P<P_o$), for example, $P=(0.9)P_0$ or less. For instance, if the diameter d of the tip is 30 microns and the height h is 60 microns, a conventional process would achieve a pitch $P_o$ of 90 microns. However, the process described herein, with at least two etches, can achieve a pitch P of about 80 microns or less. Stated another way, the multi-step etching process allows formation of unitary metallic microcontacts or posts from a single metallic layer with combinations of pitch, tip diameter and height not attainable in conventional etching processes. As the number of etching steps increases, the minimum attainable pitch for a given tip diameter and height decreases.

Figure 14:
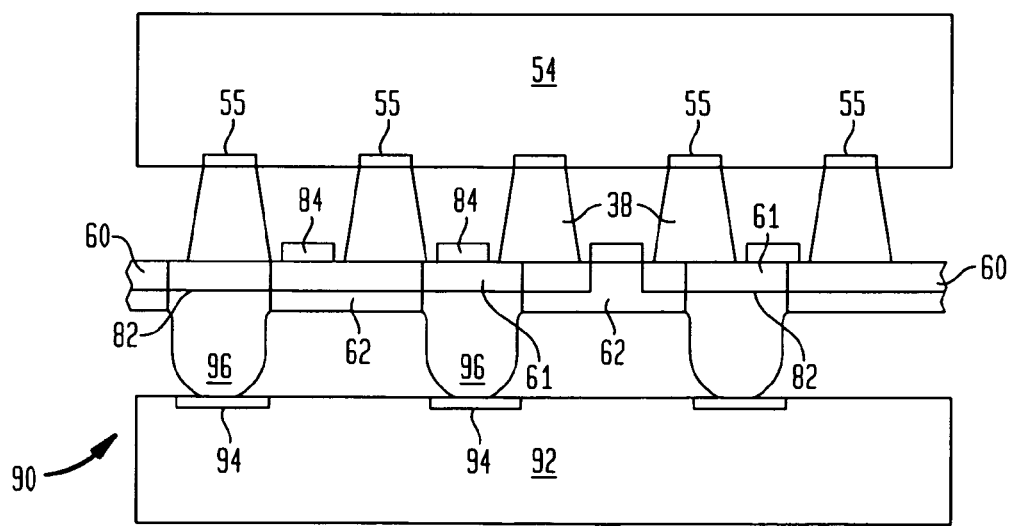
FIG. 14 is a schematic illustration of a microelectronic assembly.

Referring now to FIG. 14, a microelectronic package 90 is shown using a package element or chip carrier having microcontacts 38 as discussed above. The chip carrier includes a first dielectric layer 62 which may be formed from a material such as polyimide, BT resin or other dielectric material of the type commonly used for chip carriers. The chip carrier also includes traces 60 connected to some or all of the microcontacts 38. The traces incorporate terminals 61. The microcontacts 38 project from a first side of dielectric layer 62, facing upwardly as seen in FIG. 14. Dielectric layer 62 has openings 82, and terminals 61 are exposed at the second or downwardly facing surface of the first dielectric layer 62 through openings 82. The carrier further includes an optional second dielectric layer 84.

The tips of microcontacts 38 are bonded to contacts 55 of a microelectronic element such as a semiconductor chip or die 54. For example, the tips of the microcontacts may be solder-bonded to the contacts 55 of the microelectronic element. Other bonding processes, such as eutectic bonding or diffusion bonding, may be employed. The resulting packaged microelectronic element has some or all of contacts 55 on the microelectronic element connected to terminals 61 by the microcontacts and traces. The packaged microelectronic element may be mounted to a circuit panel 92, such as a printed circuit board by bonding terminals 61 to pads 94 on the circuit board. For instance, pads 94 on the circuit panel 92 may be soldered to the terminals 61, at openings 82, using solder balls 96.

The connection between the microcontacts 38 and the contacts 55 of the microelectronic element can provide a reliable connection even where the contacts 55 are closely spaced. As discussed above, the microcontacts 38 can be formed with reasonable tip diameters and height. The appreciable tip diameter can provide substantial bond area between the tip of each microcontact and the contact of the microelectronic element. In service, differential thermal expansion and contraction of the chip 54 relative to the circuit panel 92 can be accommodated by bending and tilting of microcontacts 38. This action is enhanced by the height of the microcontacts. Moreover, because the microcontacts are formed from a common metal layer, the heights of the microcontacts are uniform to within a very close tolerance. This facilitates engagement and formation of robust bonds between the microcontact tips with the contacts of the chip or other microelectronic element.

The structure of the chip carrier can be varied. For example, the chip carrier may include only one dielectric layer. The traces may be disposed on either side of the dielectric layer. Alternatively, the chip carrier may include a multi-layer dielectric, and may include multiple layers of traces, as well as other features such as electrically conductive ground planes.

Figure 15:
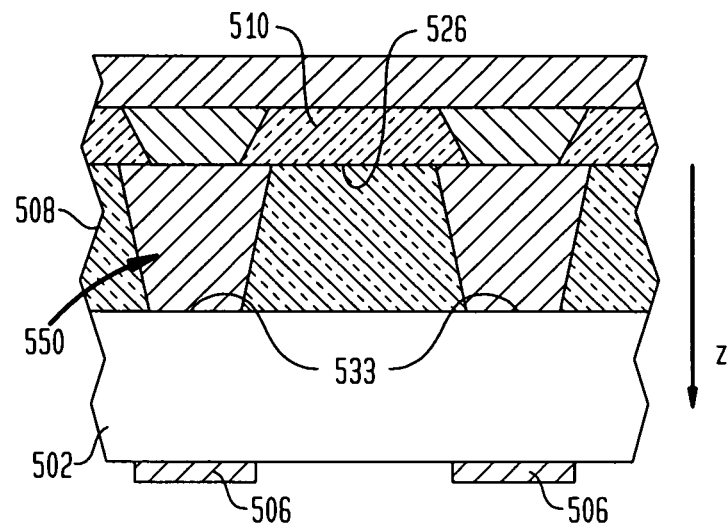
FIG. 15 is another schematic illustration of a microelectronic assembly.

A process for further embodiment of the invention uses a structure having post portions 550 (FIG. 15) projecting from a surface 526 such as a surface of dielectric layer 510. Post portions 550 may be formed by any process, but desirably are formed by an etching process similar to those discussed above. After formation of portions 550, a metallic or other conductive layer 502 is applied over the tips 533 of post portions 550. For example, layer 502 may be laminated on the structure incorporating portions 550, and metallurgically bonded to the tips of post portions 550. Layer 502 is selectively treated so as to remove material of the layer remote from post portions 550, but leave at least part of the layer thickness overlying post portions 550, and thereby form additional post portions 504 (FIG. 16) aligned with post portions 550, and thus form composite microcontacts, each including a proximal post portion 550 close to the substrate and a distal post portion 504 remote from the substrate, the distal portion projecting in the vertical or z direction from the proximal portion. The treatment applied to layer 502 may include an etching process as discussed above, using spots of an etch-resistant material 506 aligned with post portions 550. A protective layer such as a dielectric encapsulant 508 may be applied to cover post portions 550 before etching layer 502. Alternatively or additionally, post portions 550 may be plated or otherwise covered with an etch-resistant conductive material such as nickel or gold before etching layer 502.

The process of building up successive post portions may be repeated so as to form additional portions on portions 504, so that microcontacts of essentially any length can be formed. The long microcontacts provide increased flexibility and movement of the post tips. Where one or more dielectric encapsulant layers are left in place around the already-formed post portions, such as layer 508 in FIGS. 15 and 16, the encapsulant desirably is compliant so that it does not substantially limit flexure of the posts. In other embodiments, the encapsulant is removed before the components are used. Although the microcontacts are illustrated in conjunction with a dielectric substrate 522 and traces 528 similar to those discussed above, this process can be used to fabricate microcontacts on essentially any structure.

Figure 16:
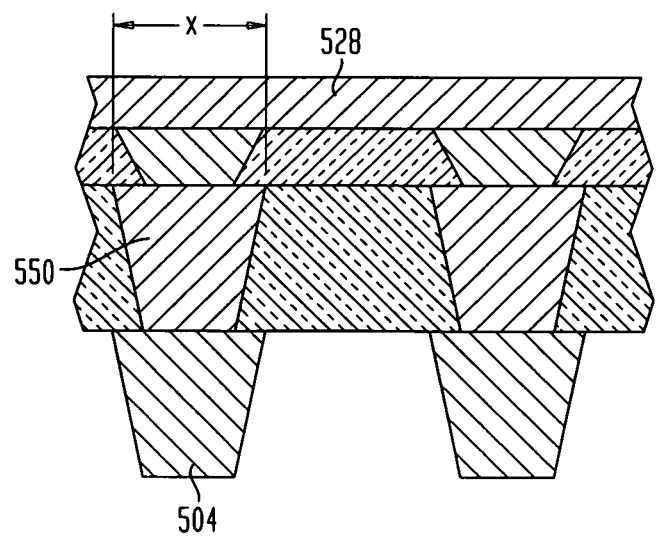
FIG. 16 is yet another schematic illustration of a microelectronic assembly.

As shown in FIG. 16, each microcontact has a horizontal or width dimension x which varies over the vertical or z-direction extent of the proximal post portion 550 and which increases abruptly, in substantially stepwise fashion, at the juncture between the proximal post portion 550 and the distal portion 504, and varies along the vertical extent of the distal portion. The slope of the variation in width with vertical location also changes abruptly at the juncture between the post portions. The pattern of variation of the horizontal or width dimension within each post portion depends upon the process used for etching or otherwise forming such post portion. For example, in a further embodiment, the distal post portions 504 may be formed by a multi-stage etching process as discussed above, so that each distal post portion includes different sub-portions with different functions defining the variation of width x in the vertical or z direction.

Reference is also made to the following, which are hereby incorporated by reference: U.S. patent application Ser. Nos. 10/985,126, filed Nov. 10, 2004, now U.S. Pat. No. 8,207, 604; 11/318,822, filed Dec. 27, 2005, now U.S. Pat. No. 7,632,708; 11/318,164, filed Dec. 23, 2005, now U.S. Pat. No. 8,067,267; 11/166,982, filed Jun. 24, 2005, now U.S. Pat. No. 7,495,179; 11/140,312, filed May 27, 2005, now U.S. Pat. No. 7,453,157; and U.S. Pat. No. 7,176,043.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming an element having microcontacts, comprising:
   (a) providing a first etch-resistant material at selected locations on a top surface of a substrate, a first metal being exposed at the top surface, wherein the substrate includes a first metal layer including the first metal, a second metal layer exposed at a bottom surface of the substrate, and a third metal layer between the first and second metal layers, the third metal layer including a metal different from a metal of the first and second metal layers;
   (b) etching the first metal at the top surface of the substrate by applying processing to the substrate from a location above the top surface at locations not covered by the first etch-resistant material and thereby forming first microcontact portions projecting upwardly at the selected locations;
   (c) providing a second etch-resistant material on the first microcontact portions;
   (d) further etching the first metal of the substrate to form second microcontact portions below the first microcontact portions, the second etch-resistant material at least partially protecting the first microcontact portions from etching during the further etching step, thereby patterning the first metal layer selectively with respect to the third metal layer;
   (e) patterning the second metal layer by applying processing to the substrate from a location below the bottom surface of the substrate to form the second metal layer into electrically conductive traces extending in lateral directions defining a plane; and
   (f) removing portions of the third metal layer to leave the microcontacts and the traces, such that the second microcontact portions extend away from the traces in a vertical direction transverse to the plane,
   wherein the microcontacts are configured to be bonded by at least one of solder, eutectic, or diffusion bonding to corresponding contacts on a face of a microelectronic element, the microcontacts are arranged in an array having a plurality of rows of microcontacts and a plurality of columns of microcontacts, and each microcontact is generally in the form of a body of revolution about a central axis.

2. The method of claim 1, wherein the step of etching the top surface is performed so that the first etch-resistant material projects laterally from the first microcontact portions.

3. The method of claim 1, wherein the step of providing the second etch-resistant material includes depositing the second etch-resistant material and exposing the deposited material to radiation.

4. The method of claim 3, wherein during the step of exposing the deposited material to radiation, the laterally projecting first etch-resistant material protects portions of the deposited second etch-resistant material from radiation.

5. The method of claim 1, further comprising removing the first and second etch-resistant materials.

6. The method of claim 1, wherein the step of providing the first etch-resistant material at selected locations comprises depositing the first etch-resistant material over the top surface of the substrate and the step of exposure includes placing a mask on the first etch-resistant material.

7. The method of claim 6, wherein the first etch-resistant material and the mask are exposed to radiation.

8. A method of forming an element having microcontacts, comprising:
(a) providing a first etch-resistant material at selected locations on a top surface of a substrate, a first metal being exposed at the top surface;
(b) etching the first metal at the top surface of the substrate at locations not covered by the first etch-resistant material and thereby form first microcontact portions projecting upwardly at the selected locations;
(c) providing a second etch-resistant material on the first microcontact portions;
(d) further etching the first metal of the substrate to form second microcontact portions below the first microcontact portions, the second etch-resistant material at least partially protecting the first microcontact portions from etching during the further etching step; and
(e) providing a third etch-resistant material on the second microcontact portions;
(f) further etching the first metal of the substrate to form third microcontact portions below the second microcontact portions, the third etch-resistant material at least partially protecting the first and second microcontact portions from further etching; and
(g) patterning the substrate to form electrically conductive traces extending in lateral directions defining a plane,
wherein the third microcontact portions extend away from the traces in a vertical direction transverse to the plane, and
wherein the microcontacts are configured to be bonded by at least one of solder, eutectic, or diffusion bonding to corresponding contacts on a face of a microelectronic element, the microcontacts are arranged in an array having a plurality of rows of microcontacts and a plurality of columns of microcontacts, and each microcontact is generally in the form of a body of revolution about a central axis.

9. The method of claim 1, wherein the first and second etch-resistant materials are gold.

10. The method of claim 1, wherein the first and second etch-resistant materials are a photoresist.

11. A method of forming an element having microcontacts, comprising:
(a) applying a final etch-resistant material to an in-process substrate so that the final etch-resistant material at least partially covers first microcontact portions integral with the substrate and projecting upwardly from a surface of the substrate, wherein the substrate includes a first metal layer including a first metal exposed at the surface of the substrate, a second metal layer exposed at a bottom surface of the substrate, and a third metal layer between the first and second metal layers, the third metal layer including a metal different from a metal of the first and second metal layers;
(b) etching the first metal at the surface of the substrate by applying processing to the substrate from a location above the surface so as to leave second microcontact portions below the first microcontact portions and integral therewith, the final etch-resistant material at least partially protecting the first microcontact portions from etching during the etching step, thereby patterning the first metal layer selectively with respect to the third metal layer;
(c) patterning the second metal layer by applying processing to the substrate from a location below the bottom surface of the substrate to form the second metal layer into electrically conductive traces extending in lateral directions defining a plane; and
(d) removing portions of the third metal layer to leave the microcontacts and the traces, such that the second microcontact portions extend away from the traces in a vertical direction transverse to the plane,
wherein the microcontacts are configured to be bonded by at least one of solder, eutectic, or diffusion bonding to corresponding contacts on a face of a microelectronic element, the microcontacts are arranged in an array having a plurality of rows of microcontacts and a plurality of columns of microcontacts, and each microcontact is generally in the form of a body of revolution about a central axis.

12. The method of claim 11, further comprising forming the in-process substrate by
(e) providing a preliminary etch-resistant material at selected locations on a top surface of the substrate; and
(f) etching the top surface of the substrate so as to remove portions of the substrate not covered by the preliminary etch-resistant material and thereby leave the first microcontact portions projecting upwardly from the etched surface.

13. The method of claim 12, wherein the step of providing the preliminary etch-resistant material at selected locations includes providing the preliminary etch-resistant material over the top surface entirely and supplying a mask atop the preliminary etch-resistant material to expose the preliminary etch-resistant material to radiation.

14. The method of claim 11, wherein the first microcontact portions have vertically-extensive side walls and the final etch-resistant material at least partially covers the side walls of the first microcontact portions.

15. The method of claim 12, further comprising removing the preliminary and the final etch-resistant materials.

16. The method of claim 1, wherein step (e) is performed after step (d).

17. The method of claim 1, further comprising:
(g) forming a dielectric layer, wherein said traces contact at least portions of said dielectric layer.

18. The method of claim 11, wherein step (c) is performed after step (b).

19. The method of claim 12, further comprising:
(g) forming a dielectric layer, wherein said traces contact at least portions of said dielectric layer.

20. The method of claim 1, wherein the microcontacts are formed with heights and diameters configured to permit sufficient bending and tilting of the microcontacts to accommodate differential thermal expansion and contraction of a microelectronic element relative to the element when the microcontacts are bonded to corresponding contacts of the microelectronic element.

21. The method of claim 1, wherein a minimum pitch between the microcontacts in at least one direction parallel to the top surface of the substrate is less than a sum of a diameter of one of the microcontacts and a height of one of the microcontacts.

22. The method of claim 11, wherein the microcontacts are formed with heights and diameters configured to permit sufficient bending and tilting of the microcontacts to accommodate differential thermal expansion and contraction of a microelectronic element relative to the element when the microcontacts are bonded to corresponding contacts of the microelectronic element.

23. The method of claim 11, wherein a minimum pitch between the microcontacts in at least one direction parallel to the surface of the substrate is less than a sum of a diameter of one of the microcontacts and a height of one of the microcontacts.

24. The method of claim 1, wherein each microcontact defines a minimum width, and the minimum width of each microcontact is located in the second microcontact portion adjacent the substrate.

25. The method of claim 11, wherein each microcontact defines a minimum width, and the minimum width of each microcontact is located in the second microcontact portion adjacent the substrate.

* * * * *

UNITED STATES PATENT AND TRADEMARK OFFICE
CERTIFICATE OF CORRECTION

PATENT NO. : 8,641,913 B2  
APPLICATION NO. : 11/717587  
DATED : February 4, 2014  
INVENTOR(S) : Belgacem Haba et al.

Page 1 of 1

It is certified that error appears in the above-identified patent and that said Letters Patent is hereby corrected as shown below:

In the Claims:

Claim 6, Col. 10, Line 66, "The method of claim 1" should read -- The method of claim 3 --

Signed and Sealed this  
Twenty-fourth Day of June, 2014

Michelle K. Lee  
*Deputy Director of the United States Patent and Trademark Office*